(12) United States Patent
Inoue et al.

(10) Patent No.: US 8,801,951 B2
(45) Date of Patent: Aug. 12, 2014

(54) PLASMA PROCESSING METHOD

(75) Inventors: Yoshiharu Inoue, Kudamatsu (JP);
Michikazu Morimoto, Kudamatsu (JP);
Tsuyoshi Matsumoto, Kudamatsu (JP);
Tetsuo Ono, Kudamatsu (JP);
Tadamitsu Kanekiyo, Kudamatsu (JP);
Mamoru Yakushiji, Shunan (JP);
Masakazu Miyaji, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 128 days.

(21) Appl. No.: 13/210,490

(22) Filed: Aug. 16, 2011

(65) Prior Publication Data
US 2013/0001197 A1 Jan. 3, 2013

(30) Foreign Application Priority Data
Jun. 30, 2011 (JP) .................................. 2011-145164

(51) Int. Cl.
*C03C 15/00* (2006.01)

(52) U.S. Cl.
USPC ................. 216/67; 216/37; 438/689; 438/692

(58) Field of Classification Search
USPC ................................ 216/37, 67; 438/689, 692
See application file for complete search history.

(56) References Cited

U.S. PATENT DOCUMENTS

| 6,759,339 | B1 * | 7/2004 | Choi et al. ..................... 438/710 |
| 7,851,532 | B2 * | 12/2010 | Kim et al. ..................... 524/401 |
| 7,910,489 | B2 * | 3/2011 | Kim et al. ..................... 438/717 |
| 2007/0181145 | A1 | 8/2007 | Ishizuka et al. | |

FOREIGN PATENT DOCUMENTS

| JP | 60-115232 | 6/1985 |
| JP | 6-267895 | 9/1994 |
| KR | 10-2006-0127104 | 12/2006 |

\* cited by examiner

*Primary Examiner* — Lan Vinh
*Assistant Examiner* — Maki Angadi
(74) *Attorney, Agent, or Firm* — Antonelli, Terry, Stout & Kraus, LLP.

(57) ABSTRACT

In a plasma processing method for conducting etching on an object to be processed by generating plasma from depositional gas introduced into a processing chamber and exposing the object to be processed to the plasma in a state in which radio frequency power is applied, the object to be processed is etched under etching conditions that a deposit film on an inner wall of the processing chamber becomes amorphous by repeating a first period during which the object to be processed is exposed to plasma and a second period during which the object to be processed is exposed to plasma and an etching rate is lower as compared with the first period. Consequently, particles due to increase in the number of processed sheets of the object to be processed can be suppressed.

8 Claims, 3 Drawing Sheets

PLASMA PROCESSING METHOD

BACKGROUND OF THE INVENTION

The present invention relates to a plasma processing method using a plasma processing apparatus and, in particular, to a plasma processing method which suppresses particles.

For manufacturing highly minitualized, complicated semiconductor devices, techniques for plasma-etching of a film, which is a material to be etched, with high selectivity and perpendicularity are needed. As one of them, it has become an important problem to plasma-etch a silicon nitride ($Si_3N_4$) film perpendicularly with high selectivity with respect to a silicon oxide ($SiO_2$) film used as material of an underlying layer or a mask.

As a technique for solving this problem, a method for etching a silicon nitride film with high selectivity with respect to a silicon oxide film by using gas composed of C, H, and F and having a ratio of F to H of 2 or less such as $CH_3F$ and $CH_2F_2$ is disclosed in JP-A-60-115232. Furthermore, a technique for enhancing the selectivity by increasing and decreasing a wafer bias power value during silicon nitride etching is disclosed in JP-A-6-267895.

SUMMARY OF THE INVENTION

In the above-described related techniques, the high selectivity and profiles of high perpendicularity are realized simultaneously. Since plasma of $CH_3F$ gas or $CH_2F_2$ gas is used, however, a large amount of reaction products containing carbon having high deposition tendency is generated. Therefore, a large amount of carbon-base reaction products are deposited on an inner wall of a plasma processing chamber. Once a certain number of sheets are processed, a deposit film peels off and falls on a wafer as particles. Failures in the etching process occur with the particles of the sizes in the orders of nanometers to micrometers which have fallen on the wafer.

Further, the above-mentioned problem is not limited to etching using plasma of $CH_3F$ gas or $CH_2F_2$ gas but it is also a problem common to plasma etching using depositional gas.

Therefore, the present invention provides a plasma processing method capable of suppressing particles due to increase in the number of processed sheets of the object to be processed in plasma processing using depositional gas.

In accordance with the present invention, in a plasma processing method for conducting etching on an object to be processed by generating plasma from depositional gas introduced into a processing chamber and exposing the object to be processed mounted on a sample stage which is provided in the processing chamber to the plasma in a state in which radio frequency power is applied to the object to be processed, it is characterized by etching of the object to be processed under an etching condition that a deposit film on an inner wall of the processing chamber becomes amorphous, by repeating a first period during which the object to be processed is exposed to the plasma and a second period during which the object to be processed is exposed to the plasma and an etching rate on the object to be processed is lower as compared with the first period.

Furthermore, in accordance with the present invention, in a plasma processing method for suppressing deposition on an inner wall surface of a processing chamber while conducting etching on an object to be processed by generating plasma from depositional gas introduced into the processing chamber and exposing the object to be processed mounted on a sample stage which is provided in the processing chamber to the plasma in a state in which radio frequency power is applied to the object to be processed, it is characterized by that the radio frequency power is time-modulated and applied to the object to be processed intermittently.

With the plasma processing method according to the present invention, particles due to increase in the number of processed sheets of the object to be processed can be suppressed in plasma processing using depositional gas.

Other objects, features, and advantages of the invention will become apparent from the following description of the embodiments of the invention taken in conjunction with the accompanying drawings.

DESCRIPTION OF THE EMBODIMENTS

Figure 1:
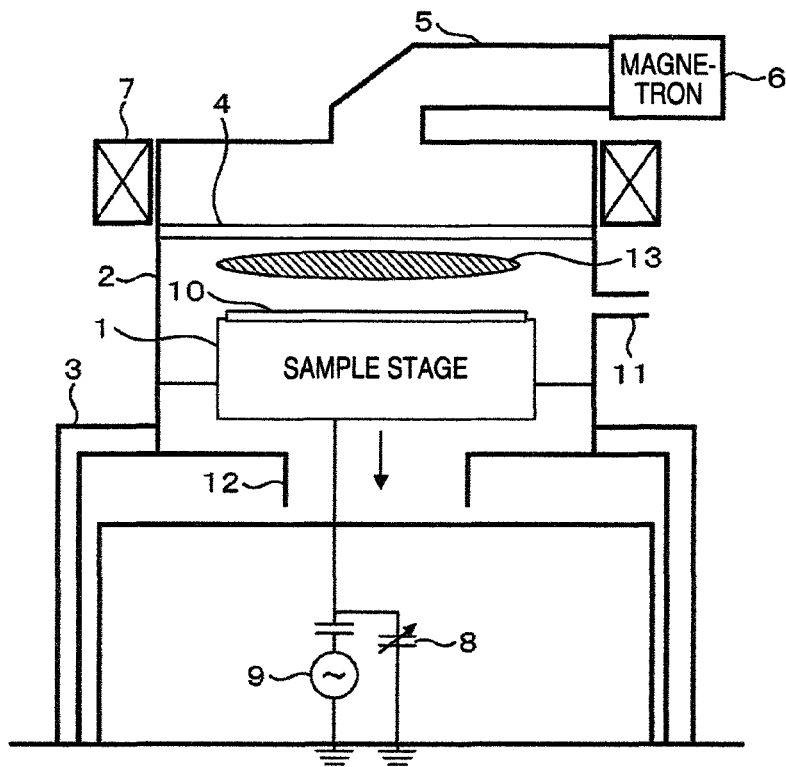
FIG. 1 is a schematic sectional view of a plasma etching apparatus according to the present invention.

First, an example of a plasma etching apparatus for executing a plasma processing method according to the present invention is described. FIG. 1 is a schematic sectional view of a plasma etching apparatus used in the present embodiment. The plasma etching apparatus of the present embodiment is an ECR (Electron Cyclotron Resonance) plasma etching apparatus using a microwave and including a sample stage 1 for placing a wafer 10 which is an object to be processed thereon, a processing chamber 2 having the sample stage 1 therein, a frame 3 for supporting the processing chamber 2, a magnetron 6 opposed to the sample stage 1 to generate a microwave, a waveguide 5 for propagating the microwave generated from the magnetron 6 to the processing chamber 2, a dielectric top plate 4 for transmitting the microwave propagated through the waveguide 5, a solenoid coil 7 provided outside the processing chamber 2 to generate a static magnetic field, a radio frequency power supply 9 for applying radio frequency power to the sample stage 1, and an exhaust unit (not illustrated) for controlling the inside of the processing chamber 2 to a predetermined pressure.

The radio frequency power supply 9 can apply either continuous radio frequency power or time-modulated intermittent radio frequency power to the sample stage 1. Furthermore, a DC voltage from a DC power supply 8 is applied to the sample stage 1 to make the wafer 10 adhere to a mounting surface of the sample stage 1 by electrostatic chuck.

Plasma processing of the wafer 10 using the present plasma etching apparatus is described next. The wafer 10 is mounted on the sample stage 1 via a transfer port 11 by a transfer unit (not illustrated). The microwave generated from the magnetron 6 is supplied into the processing chamber 2 via the waveguide 5 and the top plate 4. As a gas supplied into the processing chamber 2 by a gas supply unit (not illustrated) is exhausted via an exhaust port 12 by an pump unit (not illustrated), the pressure in the processing chamber 2 is controlled to become a predetermined pressure and high density plasma 13 is generated in the processing chamber 2 by interaction between the microwave supplied into the processing chamber and a static magnetic field generated by the solenoid coil 7. The wafer 10 mounted on the sample stage 1 is subjected to plasma processing using the plasma 13. Furthermore, radio frequency power from the radio frequency power supply 9 is applied to the sample stage 1 to pull ions within the plasma 13 to the wafer 10 and to conduct ion-assisted etching. Then, the wafer 10 for which the plasma processing finishes is transferred out from the processing chamber 2 via the transfer port 11 by the transfer unit (not illustrated).

Figure 2:
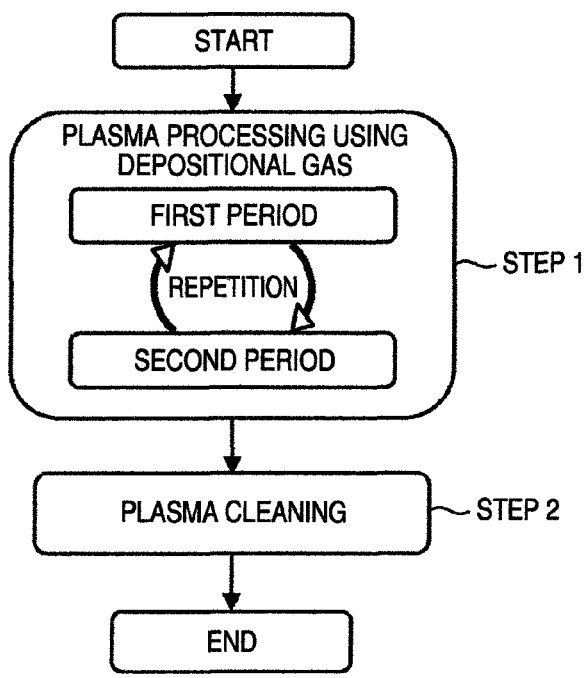
FIG. 2 is a flow diagram showing plasma processing according to the present invention.

The plasma processing method according to the present invention using the above-described plasma etching apparatus is described next. As shown in FIG. 2, first at Step 1, the wafer 10 is subjected to plasma processing by using a depositional gas, which is a gas of a high adsorption coefficient, while repeating a first period and a second period. Here, the second period is a period during which reaction products are generated having a composition different from that of reaction products generated during the first period. Furthermore, the first period and the second period are repeated at such a frequency that each of a thickness to which the reaction products generated during the first period is deposited on the inner wall of the processing chamber 2 and a thickness to which the reaction products generated during the second period is deposited on the inner wall of the processing chamber 2 is 1 nm or less.

Then, plasma cleaning is conducted in the processing chamber 2 at Step 2. The plasma cleaning may be conducted in either of a state in which the wafer 10 is mounted on the sample stage 1 and a state in which the wafer 10 is not mounted on the sample stage 1. Furthermore, in the case where the plasma cleaning is executed in the state in which the wafer 10 is mounted on the sample stage 1, the wafer 10 at Step 1 and the wafer 10 at Step 2 may be the same or may be different from each other.

The present invention is regarding the plasma processing method in which Step 1 and Step 2 are conducted as described heretofore. Particles generated along with an increase in the number of processed sheets of the wafer 10 which is the object to be processed can be suppressed. It is considered that this effect is brought about by an action described hereafter.

Figure 3A:
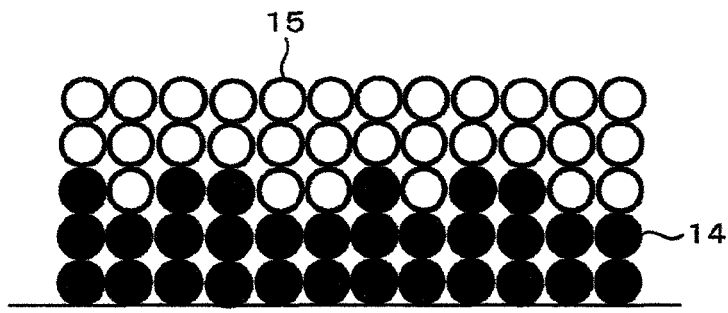
FIGS. 3A and 3B are diagrams showing deposition states of reaction products according to a difference in plasma processing method.
Figure 3B:
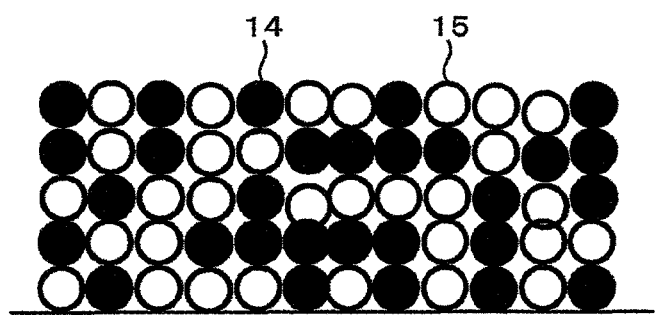

FIGS. 3A and 3B are diagrams for explaining the generation and suppression of particles. Black circles shown in FIGS. 3A and 3B indicate the reaction products 14 generated during the first period, whereas white circles indicate the reaction products 15 generated during the second period.

FIG. 3A is a schematic sectional view of the reaction products deposited on the inner wall of the processing chamber 2 when the first period and the second period are repeated at such a frequency that either a thickness to which the reaction products generated during the first period is deposited on the inner wall of the processing chamber 2 or a thickness to which the reaction products generated during the second period is deposited on the inner wall of the processing chamber 2 becomes thicker than 1 nm. Since in this case there is a time long enough for the reaction products to be deposited on the inner wall of the processing chamber 2 in the first period or the second period, a deposition layer can be formed and a deposit film becomes a structure of a stacked layer type. The deposit film of the stacked layer type has a binding energy between molecules stronger than a plasma potential of ions in each of a black circle layer and a white circle layer and has tolerance to radicals. Therefore, volatilization is hard to occur and the rate of deposition of the reaction products on the inner wall of the processing chamber 2 is higher than the rate at which the deposit film is removed by ions and radicals incident on the inner wall of the processing chamber 2 so that the thickness of the deposit film formed by the reaction products increases. And, since interlayer binding between a black circle layer and a white circle layer is weak and it has a tendency of readily peeling off, when there is a spot where a layer section is exposed, for example, the layer begins to peel off and falls onto the wafer 10, resulting in particles.

FIG. 3B is a schematic sectional view of reaction products deposited on the inner wall of the processing chamber 2 when the first period and the second period are repeated at such a frequency that each of the thickness to which the reaction products generated during the first period is deposited on the inner wall of the processing chamber 2 and the thickness to which the reaction products generated during the second period is deposited on the inner wall of the processing chamber 2 is 1 nm or less. Since in this case there isn't a time long enough for the reaction products to be deposited on the inner wall of the processing chamber 2 in each of the first period and the second period, a black circle layer or a white circle layer cannot be formed and the deposit film has a structure of an amorphous type of black circles and white circles. The deposit film of the amorphous type has a binding energy between molecules which is equivalent to or less than the plasma potential of ions and has weakened tolerance to radicals. Therefore, the deposit film is easier to volatilize and the rate at which the deposit film is removed by ions and radicals incident on the inner wall of the processing chamber 2 is higher than the rate of deposition of the reaction products on the inner wall of the processing chamber 2 to leave the thickness of the deposit film of the reaction products thin or make it approach to nearly 0. As a result, the amount of the deposit film peeling off as particles is small and particles are suppressed.

When the deposit film as shown in FIG. 3A is deposited in the processing chamber 2, it is difficult to remove the deposit film sufficiently even if the plasma cleaning is executed. If the deposit film as shown in FIG. 3B is deposited in the processing chamber 2, however, the deposit film can be removed completely by executing the plasma cleaning.

The present invention is formed of a combination of Step 1 and Step 2 as described above. Depending upon the species of the depositional gas or the flow rate of the gas used in the plasma processing according to the present invention, particles generated as the number of processed sheets of the wafer 10 which is an object to be processed increases can also be suppressed by executing at least Step 1. In other words, according to the present invention, the object to be processed is etched under an etching condition that the deposit film on the inner wall of the processing chamber becomes amorphous, by repeating the first period during which the object to be processed is exposed to plasma and the second period during which the object to be processed is exposed to plasma and the etching rate on the object to be processed is lower as compared with the first period.

In addition, the plasma processing method according to the present invention can be said to be a plasma processing method for suppressing deposition on an inner wall surface of a processing chamber while conducting etching on an object to be processed by generating plasma from depositional gas introduced into the processing chamber and exposing the object to be processed mounted on a sample stage which is provided in the processing chamber to the plasma in a state in which radio frequency power is applied to the object to be processed, wherein the radio frequency power is time-modulated and applied to the object to be processed intermittently.

According to the present invention, therefore, deposition on the inner wall of the processing chamber can be suppressed because etching repeating the first period and the second period of the above description is conducted. As a result, particles due to an increase in the number of processed sheets of the object to be processed can be suppressed. Hereafter, embodiments of the present invention are described.

Embodiment 1

First, a structure of the wafer 10 which is the object to be processed in the present embodiment is described.

Figure 4:
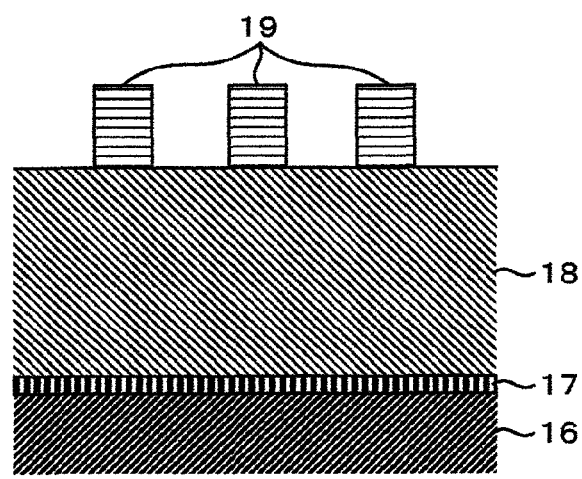
FIG. 4 is a diagram showing a film structure of a wafer used in an embodiment.

As shown in FIG. 4, there is a silicon oxide film 17 on a silicon substrate 16 and there is a silicon nitride film 18 on the silicon oxide film 17. Furthermore, there are masks 19 of a silicon oxide material patterned on the silicon nitride film 18. Incidentally, in the present embodiment, the structure or a process is not limited thereto as long as it is a process of etching the silicon nitride film 18 selectively with respect to the silicon oxide film 17. For example, the process may be a main etching process for etching a silicon nitride film with a mask pattern of a silicon oxide film where no consideration of an underlying film is needed or a process for removing a residual silicon nitride film on an underlying film of a silicon oxide film. Furthermore, in the present embodiment, the film to be etched is the silicon nitride film 18; however, it may be a film containing silicon atoms and nitrogen atoms.

Processing was conducted on the wafer 10 having the above-described structure with plasma of a mixed gas of $CH_3F$ gas and $O_2$ gas shown in Table 1 using the above-described microwave ECR plasma etching apparatus. Incidentally, the "duty ratio" in Table 1 refers to a ratio of the first period to one cycle (the sum of the first period and the second period) of a radio frequency bias.

TABLE 1

| Plasma processing conditions | |
| --- | --- |
| $CH_3F$ gas | 50 ml/min |
| $O_2$ gas | 30 ml/min |
| Process pressure | 0.5 Pa |
| Microwave power | 1000 W |
| Radio frequency bias power during first period | 400 W |
| Radio frequency bias power during second period | 0 W |
| Repetition frequency of first period and second period | 10 Hz |
| Duty ratio | 10% |
| Process time | 200 sec |

Even when twenty five sheets of the wafer 10 were processed under the conditions shown in Table 1, etching of a perpendicular profile could be conducted and particles could be suppressed.

In the present embodiment, Step 1 according to the present invention represented as "the reaction products or by-products generated during the first period are different from the reaction products or by-products generated during the second period and the first period and the second period are repeated at such a frequency that each of the thickness to which the reaction products or by-products generated during the first period is deposited on the inner wall of the processing chamber 2 and the thickness to which the reaction products or by-products generated during the second period is deposited on the inner wall of the processing chamber 2 is 1 nm or less" is executed by applying a time-modulated intermittent radio frequency bias having a repetition frequency of 10 Hz to the wafer 10. Here, the repetition frequency refers to a reciprocal of a cycle of repetition of the first period and the second period.

As for the repetition frequency of the first period and the second period, 10 Hz is an optimum value in the present embodiment. As shown in Table 2, however, it may be a repetition frequency of 10 Hz or higher. Incidentally, Table 2 presents data showing a tolerable range of particles with respect to the repetition frequency with the duty ratio fixed to 50% and a tolerable range of particles with respect to the radio frequency bias power during the first period.

In Table 2, "A" represents that etching of a perpendicular profile is possible and the number of particles is in a tolerable range, "B" represents that the number of particles is not tolerable, and "C" represents that etching is impossible.

TABLE 2

Dependence of tolerability of particles on repetition frequency

| Radio frequency bias power during first period (time average power) | Repetition frequency of first period and second period | | | | |
| --- | --- | --- | --- | --- | --- |
| | 0.1 Hz | 1 Hz | 10 Hz | 100 Hz | 2000 Hz |
| 10 W (5 W) | C | C | C | C | C |
| 20 W (10 W) | C | C | C | C | C |
| 40 W (20 W) | C | C | C | C | C |
| 70 W (35 W) | B | A | A | A | A |
| 100 W (50 W) | B | A | A | A | A |
| 200 W (100 W) | B | B | A | A | A |
| 400 W (200 W) | B | B | B | A | A |

As shown in Table 2, when the repetition frequency of the first period and the second period of the radio frequency bias is 1 Hz and higher and 2,000 Hz and lower, an area of "A" exists and the area of "A" increases as the repetition frequency increases. This is because the $CH_3F$ gas is used as the depositional gas and consequently the film thickness to which each of the reaction products generated during the first period and the reaction products generated during the second period are deposited on the inner wall of the processing chamber 2 becomes 1 nm or less when the repetition frequency is 1 Hz and higher and 2,000 Hz and lower.

Also in order to conduct etching of perpendicular processing, it is necessary to make the radio frequency bias during the first period greater than 40 W. However, 40 W is a value at the duty ratio of 50%; for calculating a radio frequency bias power during the first period to conduct etching in perpendicular processing at another duty ratio, it is necessary to convert 40 W to time-averaged power. Incidentally, the time-averaged power is obtained as a product of the radio frequency bias power during the first period and the duty ratio.

For conducting etching in perpendicular processing, therefore, it is necessary to make the time average of the radio frequency bias power greater than 20 W. Furthermore, since the wafer 10 of a diameter of 300 mm is used, the time-averaged power of the radio frequency bias is needed to be 0.03 W or more once it is converted to per 1 $cm^2$ of the wafer.

This is because the gas used at Step 1 generates reaction products of a high deposition rate on the inner wall of the processing chamber 2 and, when the time-averaged power of the radio frequency bias is 20 W or less, the deposition rate is higher than the etching rate and consequently the etching makes no progress. Or it is because the ion energy is insufficient and the etching profile takes a tapered profile. Furthermore, in this case, although a deposit film of the stacked layer type is not formed, a reaction product of a single component is deposited and the deposit of the single component falls onto the wafer 10 once it is deposited to a certain thickness.

In the present embodiment, a mixed gas composed of $CH_3F$ gas and $O_2$ gas is used. When inert gas such as Ar gas, Xe gas, Kr gas, He gas, or $N_2$ gas is added, however, effects similar to those of the present embodiment can be obtained. Furthermore, while $CH_3F$ gas is used as a deposition gas in the present embodiment, hydrofluorocarbon gas such as $CHF_3$ gas or $CH_2F_2$ gas may be used to obtain effects similar to those of the present embodiment. Especially, when a gas having a ratio of fluorine to hydrogen of 2 or less is used out of hydrofluorocarbon gas, it also becomes possible to etch a silicon nitride film (a film containing N and Si) with high selectivity with respect to a silicon (Si) film or a silicon oxide film ($SiO_2$).

Besides, in order to etch a silicon nitride film (a film containing nitrogen atoms and silicon atoms) with high selectivity with respect to a silicon (Si) film or a silicon oxide film ($SiO_2$), using hydrofluorocarbon gas is not necessarily essential but it is sufficient that the ratio of the total sum of fluorine contained in a mixed gas used for etching to the total sum of hydrogen is 2 or less. For example, a mixed gas containing $CF_4$ gas, $CHF_3$ gas, and $CH_4$ gas may also be used.

In the present embodiment, the radio frequency bias power during the second period is set to 0 W. When the off period of the radio frequency bias (the second period in the present embodiment) becomes long such as in the case where the repetition frequency of the radio frequency bias is low or in the case where the duty ratio is small, a problem sometimes arises that the peak value (hereafter referred to as Vpp) of the radio frequency bias voltage tends to vary bit by bit.

The degree of Vpp variation is influenced by the process pressure, plasma density, or the like. The radio frequency bias power during the second period needs to only be different from the radio frequency bias power during the first period. In the case of a wafer of a diameter of 300 mm, therefore, the variation of Vpp can be suppressed by setting the radio frequency power during the second period equal to a value in the range of approximately 5 to 20 W at which the silicon nitride film can not be etched instead of setting it to 0 W completely. Incidentally, when converted to per unit area (1 $cm^2$) of the wafer, the range of 5 to 20 W becomes a range of 0.007 to 0.028 W.

Therefore, the variation of Vpp can be suppressed by setting the radio frequency bias power during the second period to a value in the range of 0.007 to 0.028 W per unit area (1 $cm^2$) of the wafer; the state of a plasma sheath on the wafer 10 can be stabilized in the second period as well because most of Vpp is imposed on the plasma sheath.

In the present embodiment, the present invention of "repeating the first period and the second period during which the reaction products different from the reaction products generated during the first period are generated" (Step 1) is applied as the radio frequency bias repeating the first period and the second period at different powers. However, Step 1 needs only that the reaction products generated during the first period differ from the reaction products generated during the second period and may be applied as measures of using pulsed microwave discharge or of supplying gas into the processing chamber 2 while the gas is time-modulated to change composition of the gas in time.

For example, when the composition of the gas is changed in time by using pulsed microwave discharge, the microwave ECR plasma etching apparatus shown in FIG. 1 should have a configuration further having a microwave power supply (not illustrated) which turns on/off microwave output generated from the magnetron 6 at an arbitrary frequency and with an arbitrary duty ratio.

Furthermore, when the composition of the gas is changed in time by supplying gas into the processing chamber 2 while temporally modulating the gas, a gas supply unit (not illustrated) in the microwave ECR plasma etching apparatus shown in FIG. 1 should have a configuration further having a control unit for supplying gas into the processing chamber while the gas is time-modulated at an arbitrary frequency.

Embodiment 2

Particles generated as the number of processed sheets of the wafer 10 increases can be suppressed by Step 1 alone as in Embodiment 1. Depending on conditions such as the gas species, a gas flow ratio, and the radio frequency bias power used at Step 1, however, suppression of particles generated as the number of processed sheets of the wafer 10 increases may not be sufficient in some cases. Hereafter, a plasma processing method which surely suppresses particles generated as the number of processed sheets of the wafer 10 increases in such a case as well is described.

Particles generated as the number of processed sheets of the wafer 10 increases can be suppressed surely by adding Step 2 which is plasma cleaning processing shown in Table 3 to Step 1 described in Embodiment 1 as shown in FIG. 2.

TABLE 3

| Plasma cleaning processing conditions | |
| --- | --- |
| $O_2$ gas | 200 ml/min |
| Process pressure | 1.0 Pa |
| Microwave power | 1000 W |
| Radio frequency bias power | 0 W |

In the present embodiment, $O_2$ gas is used in the plasma cleaning as shown in Table 3. When a deposit deposited in the processing chamber 2 is organic, $SF_6$ gas, $NH_3$ gas, or a mixed gas of $H_2$ gas and $N_2$ gas may be used. Furthermore, when the deposit deposited in the processing chamber 2 is metallic, $BCl_3$ gas or a mixed gas of $BCl_3$ gas and $Cl_2$ gas may be used instead of $O_2$ gas.

Furthermore, when Step 2 is executed, it may be in either of the state in which the wafer 10 is mounted on the sample stage 1 and the state not mounted. Also, even in the state in which the wafer 10 is mounted on the sample stage 1, the wafer 10 processed at Step 1 may be used as is at Step 2 or a wafer different from the wafer 10 processed at Step 1 may be used at Step 2.

Moreover, even though Step 2 is added after Step 1 in the present embodiment, Step 2 needs not to be executed every time after Step 1; Step 2 may be executed at every arbitrary number of processed sheets of the wafer 10 processed at Step 1 according to the amount of the deposit deposited on the inner wall of the processing chamber 2.

If the processing time of the plasma cleaning is too short, the deposit on the inner wall of the processing chamber 2 cannot be removed sufficiently. Conversely, if the processing time of the plasma cleaning is too long, specific parts (such as, for example, quartz parts) in the processing chamber 2 are changed in quality, resulting in generation of particles. Therefore, the processing time of the plasma cleaning needs to be optimized.

For example, a transition of emission of light at a wavelength of a carbon component is monitored by using a light-emission detection unit (not illustrated) during the course of the plasma cleaning. A time period required for the light-emission intensity of the carbon component to become less than 25% of a maximum value of the light-emission intensity of the carbon component which it reaches in the range of 5 to 10 seconds from the start of the plasma cleaning is calculated. A time period in the range of the calculated time period to 1.5 times thereof is taken as an optimum value of the processing time of the plasma cleaning.

Embodiment 3

Other effects by Step 2 described in Embodiment 2 are described next.

Figure 5:
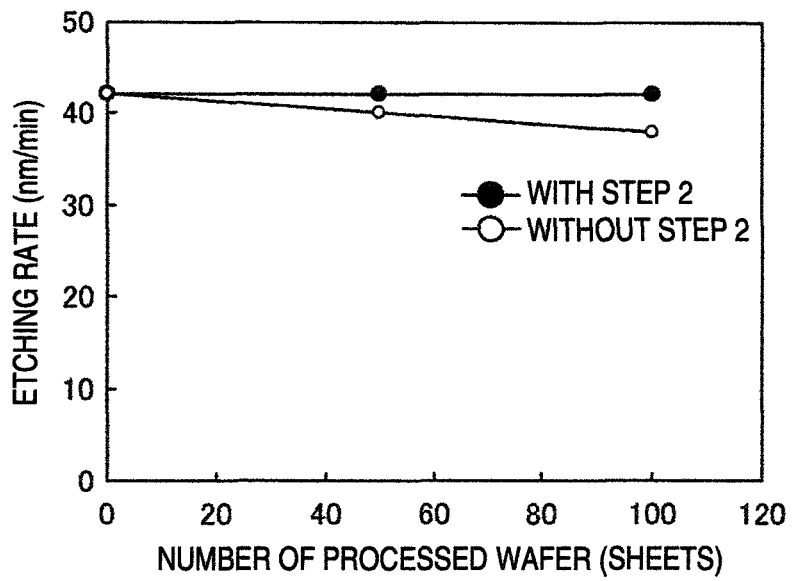
FIG. 5 is a diagram showing dependence of an etching rate of a silicon nitride film on the number of processed wafer.

FIG. 5 shows dependence of the etching rate of the silicon nitride film on the number of processed wafer 10 in the case where continuous processing is conducted on the silicon nitride film under processing conditions of the $CH_3F$ gas flow rate of 50 ml/min, the $O_2$ gas flow rate of 20 ml/min, the process pressure of 1.0 Pa, and the continuous radio frequency bias of 60 W. Furthermore, in FIG. 5, dependences of the etching rate of the silicon nitride film on the number of processed wafer 10 are compared with and without the plasma processing (Step 2) conducted with the $O_2$ gas flow rate of 100 ml/min and the process pressure of 2.0 Pa after the silicon nitride film is etched.

Without Step 2 the etching rate of the silicon nitride film gradually decreases as the number of processed wafer 10 increases. On the other hand, with Step 2 decrease in the etching rate of the silicon nitride film is hardly recognized. It is considered due to the following reason.

In the case of plasma using $CH_3F$ gas, organic reaction products are deposited on the inner wall of the processing chamber 2 and a part of deposit deposited on the inner wall of the processing chamber 2 is re-dissociated by plasma 13. The re-dissociated deposit is deposited on the surface of the wafer 10 and prohibits etching. Thus, as the number of processed sheets of the wafer 10 increases, the etching rate of the silicon nitride film decreases.

On the other hand, when the plasma processing using $O_2$ gas is added, the deposit deposited on the inner wall of the processing chamber 2 can be removed and deposition of the deposit on the inner wall of the processing chamber 2 onto the surface of the wafer 10 caused by re-dissociation can be suppressed. Thus, the decrease in the etching rate of the silicon nitride film as the number of processed sheets of the wafer 10 increases can be suppressed.

When an end point of the etching finish is determined by monitoring the light emission of the reaction products, some changes in the etching rate do not pose a problem. However, when the etching amount is determined by time, for example, since the etched area is so small that the etching end point cannot be detected by light emission, a trouble arises.

Besides, in the case where a silicon nitride film located under a mask is to be etched perpendicularly as shown in FIG. 4, perpendicular etching becomes easy by turning on and off the radio frequency bias and increasing the radio frequency bias power during the first period. In etching of a silicon nitride film buried in a trench or a hole, however, the etching profile becomes independent and in etching using $CH_3F$ gas it becomes unnecessary to specifically conduct on/off modulation on the radio frequency bias.

In these cases as well, it is effective in suppressing the decrease in the etching rate of the silicon nitride film accompanied by the increase in the number of processed wafer 10 that Step 2 with plasma is added using $O_2$ gas to remove the deposit deposited on the inner wall of the processing chamber 2.

Comparing decreases in the etching rate of the silicon nitride film obtained when quartz and alumina are used as the material of the top plate 4 in the microwave ECR plasma etching apparatus shown in FIG. 1, quartz yields a smaller decrease. It can be presumed because quartz is etched by fluorine in $CH_3F$ gas and consequently deposition of the deposit becomes difficult and the cleaning becomes easier.

In addition, as results of experiments conducted with the material of parts exposed to the plasma 13 in the processing chamber 2 being changed, an effect of suppressing the decrease in the etching rate of the silicon nitride film was noticeable when 30% or more of the area exposed to the plasma 13 was formed of the quartz material. Incidentally, the area exposed to the plasma 13 refers to an area of a space above the sample stage 1 on which the wafer 10 is mounted in the microwave ECR plasma etching apparatus shown in FIG. 1.

Embodiment 4

In Embodiment 1, an embodiment that "the radio frequency bias in which the first period and the second period at different powers from each other are repeated at a frequency of 10 Hz or higher is applied to the sample stage 1" is described. Even when the repetition frequency of the first period and the second period at different powers from each other is less than 10 Hz, however, particles generated along with the increase in the number of processed sheets can be suppressed by optimizing the duty ratio which is the ratio of the first period to the repetition period of the first period and the second period at different powers from each other.

This time, the present inventors have attempted to derive mathematical expressions for "forming a deposit film of the amorphous type" according to the present invention in order to calculate the above-described optimum duty ratio from the mathematical expressions and it has been found that derivation of mathematical expressions is possible. In the present embodiment, therefore, a result of derivation of the mathematical expressions according to the present invention is described.

In order to form a deposit film of the amorphous type, the following Expressions (1) and (2) should be satisfied. In other words, by calculating a duty ratio which satisfies Expressions (1) and (2) the duty ratio can be estimated at which particles with the increase in the number of processed sheets can be suppressed.

$$\frac{Rf_c - Rf_2}{Rf_1 - Rf_2} \le \text{Duty ratio} \le \frac{9 \times Rate_2}{9 \times Rate_2 + Rate_1} \quad \text{Expression (1)}$$

$$\frac{Rf_c - Rf_2}{Rf_1 - Rf_2} \le \text{Duty ratio} \le \frac{freq}{Rate_1} \quad \text{Expression (2)}$$

Here, $Rate_1$ is a deposition rate [nm/sec] onto the inner wall of the processing chamber 2 during the first period, $Rate_2$ is a deposition rate [nm/sec] onto the inner wall of the processing chamber 2 during the second period, $Rf_1$ is a power [W] of the radio frequency bias during the first period, $Rf_2$ is a power [W] of the radio frequency bias during the second period, $Rf_c$ is a power [W] of the continuous radio frequency bias at which etching of the wafer 10 does not proceed, and freq is the repetition frequency [Hz] of the first period and the second period.

An optimized duty ratio at arbitrary $Rf_1$, $Rf_2$, and freq can be calculated by measuring $Rf_c$, $Rate_1$, and $Rate_2$ for each of the plasma processing conditions at Step 1 and substituting the measured $Rf_c$, $Rate_1$ and $Rate_2$ into Expressions (1) and (2).

Measurement methods of respective $Rf_c$, $Rate_1$, and $Rate_2$ under the conditions shown in Table 1 are described next.

$Rf_c$ is found by using a wafer (hereafter referred to as a dummy wafer) having a film containing nitrogen atoms and silicon atoms and searching for the continuous radio frequency bias power at which deposition of reaction products on the surface of the dummy wafer does not occur and etching on the dummy wafer surface does not progress.

A measurement method of $Rate_1$ and $Rate_2$ is described next.

First, three sheets of the dummy wafer are prepared and a first sheet of the dummy wafer is etched in a predetermined time under processing conditions that the radio frequency bias power is set to arbitrary $Rf_1$. Here, the predetermined time is an etching processing time which leaves the film to be etched on the dummy wafer surface to some degree.

Then, plasma cleaning is conducted under the conditions shown in Table 4 in a state in which the first etched sheet of the dummy wafer is mounted on the sample stage 1 and the time required to remove the deposit deposited on the inner wall of the processing chamber 2 during the plasma cleaning is calculated on the basis of the transition of the light emission data of the plasma cleaning. The calculated time required to remove the deposit deposited on the inner wall of the processing chamber 2 is referred to as a first plasma cleaning time.

TABLE 4

| Plasma cleaning conditions | |
|---|---|
| $O_2$ gas | 30 ml/min |
| $SF_6$ gas | 200 ml/min |
| Process pressure | 1.0 Pa |
| Microwave power | 1000 W |
| Radio frequency bias power | 0 W |

Next, the second sheet of the dummy wafer is etched for the same time as that of the first sheet of the dummy wafer under the processing conditions that the radio frequency bias power is set to 0 W.

Then, the plasma cleaning is conducted under the conditions shown in Table 4 in a state in which the second etched sheet of the dummy wafer is mounted on the sample stage 1 and the time required to remove the deposit deposited on the inner wall of the processing chamber 2 during the plasma cleaning is calculated on the basis of the transition of the light emission data of the plasma cleaning. The calculated time required to remove the deposit deposited on the inner wall of the processing chamber 2 is referred to as a second plasma cleaning time.

Next, the third sheet of the dummy wafer is etched for the same time as that of the first sheet of the dummy wafer under the processing conditions that the radio frequency bias power is set to 0 W. In etching of the third sheet of the dummy wafer, the thickness of the deposit film deposited on the inner wall of the processing chamber 2 is supposed to be the same as the thickness of the deposit film deposited on the surface of the third sheet of the dummy wafer. The film thickness of the deposit film deposited on the surface of the third sheet of the dummy wafer during the process of etching of the third sheet is measured using an optical film thickness measuring instrument and a value obtained by dividing the measured film thickness of the deposit film by the etching time of the third sheet of the dummy wafer becomes $Rate_2$.

Next, since the plasma cleaning after etching of the first sheet of the dummy wafer and the plasma cleaning after etching of the second sheet of the dummy wafer are under the same conditions, the ratio of the thickness of the deposit film deposited on the inner wall of the processing chamber 2 when the first sheet of the dummy wafer is etched to the thickness of the deposit film deposited on the inner wall of the processing chamber 2 when the second sheet of the dummy wafer is etched is equal to the ratio of the first plasma cleaning time to the second plasma cleaning time. Therefore, $Rate_1$ can be found by the following Expression (3).

$$Rate_1 = Rate_2 \times \frac{\text{First plasma cleaning time}}{\text{Second plasma cleaning time}} \quad \text{Expression (3)}$$

Measurement results of respective $Rf_c$, $Rate_1$, and $Rate_2$ found according to the above-described measurement method when the radio frequency bias power during the first period is set to arbitrary $Rf_1$ in the conditions shown in Table 1 are shown in Table 5.

TABLE 5

Measurement results of $Rf_c$, $Rate_1$, and $Rate_2$ at conditions in Table 1

| | |
|---|---|
| $Rf_c$ | 20 W |
| $Rate_1$ | $0.32 + 1.26 \times 10^{-2} + Rf_1 - 8.5 \times 10^{-6} \times Rf_1^2$ nm/sec |
| $Rate_2$ | 0.32 nm/sec |

The following Expressions (4) and (5) can be obtained by substituting the measurement results of respective $Rf_c$, $Rate_1$, and $Rate_2$ shown in Table 5 into Expressions (1) and (2), respectively.

$$\frac{20}{Rf_1} \leq \text{Duty ratio} \leq \frac{2.88}{3.2 + 1.26 \times 10^{-2} \times Rf_1 - 8.5 \times 10^{-6} \times Rf_1^2} \quad \text{Expression (4)}$$

$$\frac{20}{Rf_1} \leq \text{Duty ratio} \leq \frac{freq}{0.32 + 1.26 \times 10^{-2} \times Rf_1 - 8.5 \times 10^{-6} \times Rf_1^2} \quad \text{Expression (5)}$$

Under the conditions shown in Table 1, comparison results between experimental data of dependence of tolerability of particles on the duty ratio and calculated results of duty ratios which satisfy Expressions (4) and (5) are shown in Tables 6 to 8 when the repetition frequency of the first period and the second period is set to 1 Hz, 10 Hz, and 100 Hz, respectively. In Tables 6 to 8, "A" represents that etching of a perpendicular profile is possible and the number of particles is in a tolerable range, "B" represents that the number of particles is not tolerable, and "C" represents that etching is impossible.

TABLE 6

Comparison results between experimental data and calculated results when repetition frequency is 1 Hz

| Radio frequency bias power during first period | Duty ratio | | | | | | | |
|---|---|---|---|---|---|---|---|---|
| | 5% | | 10% | | 25% | | 50% | |
| | experimental data | calculated result | experimental data | calculated result | experimental data | calculated result | experimental data | calculated result |
| 10 W | C | C | C | C | C | C | C | C |
| 20 W | C | C | C | C | C | C | C | C |
| 40 W | C | C | C | C | C | C | C | C |
| 70 W | C | C | C | C | C | C | A | A |
| 100 W | C | C | C | C | A | A | A | A |
| 200 W | C | C | C | C | A | A | B | B |
| 400 W | C | C | A | A | B | B | B | B |

TABLE 7

Comparison results between experimental data and calculated results when repetition frequency is 10 Hz

| Radio frequency bias power during first period | Duty ratio | | | | | | | |
|---|---|---|---|---|---|---|---|---|
| | 5% | | 10% | | 25% | | 50% | |
| | experimental data | calculated result | experimental data | calculated result | experimental data | calculated result | experimental data | calculated result |
| 10 W | C | C | C | C | C | C | C | C |
| 20 W | C | C | C | C | C | C | C | C |
| 40 W | C | C | C | C | C | C | C | C |
| 70 W | C | C | C | C | C | C | A | A |
| 100 W | C | C | C | C | A | A | A | A |
| 200 W | C | C | C | C | A | A | A | A |
| 400 W | C | C | A | A | A | A | B | B |

TABLE 8

Comparison results between experimental data and calculated results when repetition frequency is 100 Hz

| Radio frequency bias power during first period | Duty ratio | | | | | | | |
|---|---|---|---|---|---|---|---|---|
| | 5% | | 10% | | 25% | | 50% | |
| | experimental data | calculated result | experimental data | calculated result | experimental data | calculated result | experimental data | calculated result |
| 10 W | C | C | C | C | C | C | C | C |
| 20 W | C | C | C | C | C | C | C | C |
| 40 W | C | C | C | C | C | C | C | C |
| 70 W | C | C | C | C | C | C | A | A |
| 100 W | C | C | C | C | A | A | A | A |
| 200 W | C | C | C | C | A | A | A | A |
| 400 W | C | C | A | A | A | A | A | B |

Figure 6:
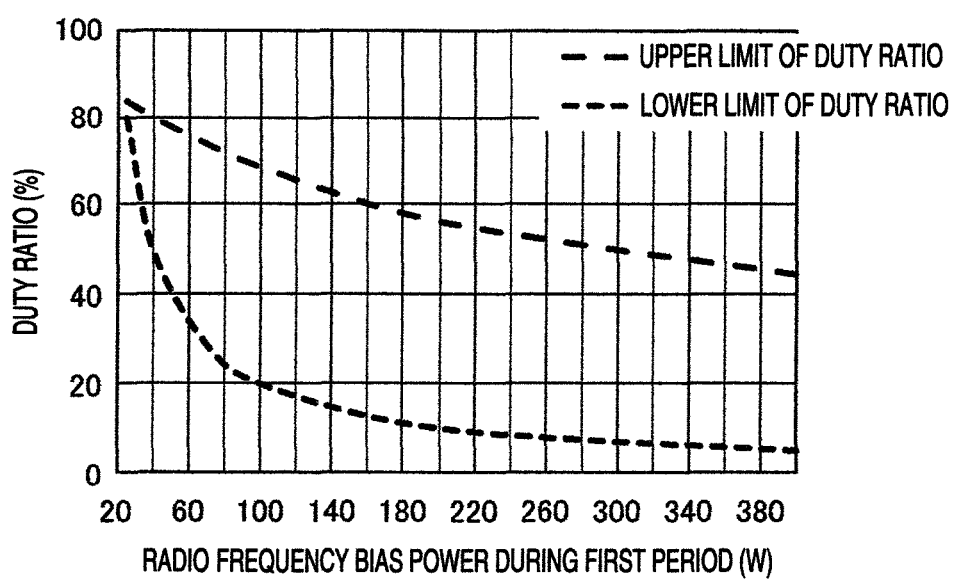
FIG. 6 shows a range of a duty ratio in which particles due to increase in the number of processed sheets can be suppressed at a given radio frequency bias power during a first period.

As shown in Tables 6 to 8, calculated results obtained from Expressions (4) and (5) agree with experimental data except data obtained when the repetition frequency of the first period and the second period is 100 Hz, the radio frequency bias power during the first period is 400 W, and the duty ratio is 50%. At an arbitrary radio frequency bias power during the first period ($Rf_1$), an arbitrary radio frequency bias power during the second period ($Rf_2$), and an arbitrary repetition frequency of the first period and the second period (freq), therefore, a duty ratio which makes it possible to suppress particles due to the increase in the number of processed sheets can be calculated and estimated from Expressions (1) and (2). Furthermore, as shown in FIG. 6, a range of the duty ratio which makes it possible to suppress particles due to the increase in the number of processed sheets can be graphically shown with respect to an arbitrary radio frequency bias power during the first period, for example, when the repetition frequency of the first period and the second period is 10 Hz.

As described heretofore, according to the present invention expressed by the present embodiment, the mathematical expressions to obtain the duty ratio which makes it possible to suppress particles due to the increase in the number of processed sheets at an arbitrary radio frequency bias power during the first period ($Rf_1$), an arbitrary radio frequency bias power during the second period ($Rf_2$), and an arbitrary repetition frequency of the first period and the second period (freq) have been derived. Thus, the duty ratio which makes it possible to suppress particles due to the increase in the number of processed sheets at an arbitrary radio frequency bias power during the first period ($Rf_1$), an arbitrary radio frequency bias power during the second period ($Rf_2$), and an arbitrary repetition frequency of the first period and the second period (freq) can be estimated by calculating a duty ratio which satisfies both Expressions (1) and (2).

In Embodiments 1 to 4, examples of etching of the silicon nitride film (the film containing N and Si) using hydrofluorocarbon gas have been described heretofore. However, the present invention can also be applied to etching of a silicon oxide film ($SiO_2$) using fluorocarbon gas.

Furthermore, the present invention described in Embodiments 1 to 3 is not restricted to application to the microwave ECR plasma etching apparatus, but can also be applied to plasma etching apparatuses equipped with a plasma source of a capacitive coupling scheme or an inductive coupling scheme.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of plasma processing in a processing chamber, comprising the steps of:
  plasma-etching a film comprising nitrogen atoms and silicon atoms, using a mixture of a hydrofluorocarbon gas and an oxygen gas, while supplying a radio frequency power to an object with the film to be processed so as to enable plasma-etching of the film, the radio frequency power having a first amplitude in a first period of plasma-etching and a second amplitude in a second period of plasma-etching of a plasma-etching cycle of the first and second periods which is repeated for the plasma-etching of the film;
  wherein the second amplitude of the second period of plasma-etching is smaller than the first amplitude of the first period of plasma-etching; and
  configuring a frequency of the plasma-etching cycle so that a thickness of deposition of a by-product generated during the first period of plasma-etching onto an inner wall surface of the processing chamber is no greater than 1 nm and a thickness of deposition of a by-product generated during the second period of plasma-etching onto the inner wall surface of the processing chamber is no greater than 1 nm.

2. The method according to claim 1, wherein the frequency of the plasma-etching cycle is at least 1 Hz and no greater than 2,000 Hz.

3. The method according to claim 2, comprising a further step of plasma-cleaning the processing chamber which is a separate step from the step of plasma-etching of the film.

4. The method according to claim 3, wherein the step of plasma-etching of the film is performed using the hydrofluorocarbon gas which is a $CH_3F$ gas, and the separate step of the plasma-cleaning is performed using an oxygen gas.

5. A method of plasma processing in a processing chamber, comprising the steps of:
  plasma-etching a film comprising nitrogen atoms and silicon atoms, with plasma of a mixture of a hydrofluorocarbon gas and an oxygen gas, the plasma being generated by a radio frequency power to enable plasma-etching of the film, the radio frequency power having a first amplitude in a first period of plasma-etching and a second amplitude in a second period of plasma-etching of a plasma-etching cycle of the first and second periods which is repeated for the plasma-etching of the film;
  wherein the second amplitude of the second period of plasma-etching is smaller than the first amplitude of the first period of plasma-etching; and
  configuring a frequency of the plasma-etching cycle so that a thickness of deposition of a by-product generated during the first period of plasma-etching onto an inner wall surface of the processing chamber is no greater than 1 nm and a thickness of deposition of a by-product generated during the second period of plasma-etching onto the inner wall surface of the processing chamber is no greater than 1 nm.

6. The method according to claim 1, wherein the frequency of the plasma-etching cycle is at least 1 Hz and no greater than 2,000 Hz.

7. The method according to claim 6, comprising a further step of plasma-cleaning the processing chamber which is a separate step from the step of plasma-etching of the film.

8. The method according to claim 7, wherein the step of plasma-etching of the film is performed using hydrofluorocarbon gas which is a $CH_3F$ gas, and the separate step of the plasma-cleaning is performed using an oxygen gas.

* * * * *